(12) United States Patent
Niu et al.

(10) Patent No.: US 12,125,420 B2
(45) Date of Patent: Oct. 22, 2024

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tong Niu, Beijing (CN); Peng Xu, Beijing (CN); Wenhui Gao, Beijing (CN); Siyu Wang, Beijing (CN); Fengli Ji, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 220 days.

(21) Appl. No.: 17/781,403

(22) PCT Filed: Jul. 26, 2021

(86) PCT No.: PCT/CN2021/108426
§ 371 (c)(1),
(2) Date: Jun. 1, 2022

(87) PCT Pub. No.: WO2023/004539
PCT Pub. Date: Feb. 2, 2023

(65) Prior Publication Data
US 2023/0132617 A1  May 4, 2023

(51) Int. Cl.
*G09G 3/00* (2006.01)
*H01L 21/768* (2006.01)
*H01L 27/02* (2006.01)

(52) U.S. Cl.
CPC ......... *G09G 3/006* (2013.01); *H01L 21/7682* (2013.01); *H01L 27/0266* (2013.01);
(Continued)

(58) Field of Classification Search
CPC .............. G09G 3/006; G09G 2330/06; G09G 2330/12; H01L 27/0266; H01L 27/0288; H01L 21/7682; G09F 9/30
(Continued)

(56) References Cited

U.S. PATENT DOCUMENTS 9,978,781 B2   5/2018  Shin et al.
10,679,561 B2  6/2020  Kim et al.
(Continued)

FOREIGN PATENT DOCUMENTS

CN   107544189 A   1/2018
CN   107767801 A   3/2018
(Continued)

*Primary Examiner* — Raul J Rios Russo
(74) *Attorney, Agent, or Firm* — Chiwin Law LLC (57) ABSTRACT

A display substrate and a display apparatus are provided. The display substrate includes a base substrate, a crack detection line and an electrostatic discharge element electrically connected to the crack detection line. The base substrate includes a main body area, an auxiliary area, and a necked-down area connecting the main body area and the auxiliary area, and a display area of the display substrate is in the main body area. The crack detection line surrounds, at least in part, the display area and extends through the necked-down area to the auxiliary area. A length direction of the necked-down area is parallel to a first direction; the main body area, the necked-down area and the auxiliary area are connected in a second direction intersecting the first direction; and the electrostatic discharge element is located in the auxiliary area.

20 Claims, 7 Drawing Sheets

(52) U.S. Cl.
CPC ..... *H01L 27/0288* (2013.01); *G09G 2330/06* (2013.01); *G09G 2330/12* (2013.01)

(58) Field of Classification Search
USPC .......................................................... 324/537
See application file for complete search history.

(56) References Cited

U.S. PATENT DOCUMENTS

| | | | |
|---|---|---|---|
| 10,761,386 | B2 | 9/2020 | Zhang et al. |
| 2015/0200145 | A1* | 7/2015 | Yoo ................... G02F 1/136259 |
| | | | 438/158 |
| 2020/0194470 | A1* | 6/2020 | Wang .................. H01L 27/1259 |
| 2021/0320163 | A1 | 10/2021 | Bang et al. |
| 2022/0077273 | A1* | 3/2022 | Qing ................... H01L 27/0248 |
| 2022/0084894 | A1* | 3/2022 | Huang ............... G01R 31/2812 |
| 2022/0221764 | A1 | 7/2022 | Li |
| 2022/0320851 | A1 | 10/2022 | Cai et al. |
| 2022/0328595 | A1* | 10/2022 | Li ........................ H10K 59/353 |
| 2023/0165077 | A1* | 5/2023 | Wei ...................... G09G 3/3233 |
| | | | 345/204 |

FOREIGN PATENT DOCUMENTS

| | | |
|---|---|---|
| CN | 108182886 A | 6/2018 |
| CN | 108254984 A | 7/2018 |
| CN | 109427752 A | 3/2019 |
| CN | 111445797 A | 7/2020 |
| CN | 111863916 A | 10/2020 |
| CN | 111999951 A | 11/2020 |
| CN | 112037656 A | 12/2020 |
| CN | 112419903 A | 2/2021 |
| CN | 113129755 A | 7/2021 |
| CN | 113540120 A | 10/2021 |
| JP | 2013011663 A | 1/2013 |

\* cited by examiner

DISPLAY SUBSTRATE AND DISPLAY APPARATUS

This application is a U.S. National Phase Entry of International Application No. PCT/CN2021/108426 filed on Jul. 26, 2021, designating the United States of America. The present application claims priority to and the benefit of the above-identified applications and the above-identified applications are incorporated by reference herein in their entirety.

TECHNICAL FIELD

Embodiments of the present disclosure relate to a display substrate and a display apparatus.

BACKGROUND

During the manufacturing of a display panel, when the display panel is impacted, cracks may occur in a base substrate and/or other layers. With the passage of time, cracks may grow increasingly and/or spread in the display panel, resulting in significant defects. For example, if cracks occur in a signal line (e.g., a data line or a scan line), the signal line may be broken or the electrical resistance of the signal line may be increased, resulting in failure to correctly transmit signals. In addition, moisture or the like may infiltrate into the display panel to reduce the reliability of a display apparatus, resulting in the display apparatus being out of order.

SUMMARY

At least an embodiment of the present disclosure provides a display substrate, comprising a base substrate, a crack detection line and an electrostatic discharge element electrically connected to the crack detection line. The base substrate comprises a main body area, an auxiliary area, and a necked-down area connecting the main body area and the auxiliary area, and a display area of the display substrate is located in the main body area. The crack detection line is surrounding, at least in part, the display area and extended through the necked-down area to the auxiliary area. A length direction of the necked-down area is parallel to a first direction; the main body area, the necked-down area and the auxiliary area are connected in a second direction which intersects the first direction; a maximum size of the necked-down area in the first direction is smaller than that of the main body area in the first direction and also smaller than that of the auxiliary area in the first direction; and the electrostatic discharge element is located in the auxiliary area.

In some examples, the necked-down area comprises a bending area which is configured to be bendable such that the auxiliary area is bent to be at a back of the main body area.

In some examples, a ratio of the maximum size of the necked-down area in the first direction to that of the main body area in the first direction ranges from ⅙ to ⅓.

In some examples, a size of the auxiliary area in the first direction increases gradually in a direction which is parallel to the second direction and away from the necked-down area.

In some examples, the auxiliary area comprises a trapezoidal region and a rectangular region connected along the second direction, and an upper base of the trapezoidal region is connected to the necked-down area; and the electrostatic discharge element is located in the trapezoidal region or the rectangular region.

In some examples, length direction of the electrostatic discharge element is parallel to any edge of one of the trapezoidal region or the rectangular region.

In some examples, the display substrate further comprise a first power line and a second power line, and a plurality of subpixels in the display area, and the first power line and the second power line are each at least partially around the display area and extend through the necked-down area to the auxiliary area, and are configured to provide a first power voltage and a second power voltage for the plurality of subpixels, respectively, with the first power voltage being higher than the second power voltage; and the electrostatic discharge element is between the first power line and the second power line in the auxiliary area.

In some examples, the first power line and the second power line are disposed in a same layer and insulated from each other; and at least a portion of the electrostatic discharge element is in the same layer with the first power line and the second power line and is between the first power line and the second power line.

In some examples, the electrostatic discharge element comprises a first end electrically connected to the crack detection line and a second end electrically connected to the first power line or the second power line.

In some examples, the crack detection line comprises a first detection line portion and a second detection line portion both located in the auxiliary area; the first detection line portion is extended from a side, far away from the second power line, of the first power line to be between the first power line and the second power line, and is electrically connected to the first end of the electrostatic discharge element; the second detection line portion extends from a side, far away from the first power line, of the second power line to be between the first power line and the second power line, and is electrically connected to the first end of the electrostatic discharge element; and the first end of the electrostatic discharge element electrically connects the first detection line portion and the second detection line portion.

In some examples, the electrostatic discharge element comprises a capacitor having a first capacitor electrode serving as the first end of of the electrostatic discharge element and a second capacitor electrode serving as the second end of the electrostatic discharge element.

In some examples, relative to the base substrate, the first capacitor electrode is in a same layer with the first power line and the second power line and is between the first power line and the second power line; the second capacitor electrode is on a side, close to the base substrate, of the first capacitor electrode, and the first capacitor electrode and the second capacitor electrode are at least overlapped in a direction perpendicular to the base substrate.

In some examples, the crack detection line is between a layer where the first capacitor electrode is located and a layer where the second capacitor electrode is located in a direction perpendicular to the base substrate.

In some examples, the first capacitor electrode comprises a U-shaped electrode and two comb-shaped electrodes that are respectively connected to two side edges of the U-shaped electrode; and the second capacitor electrode is surrounded, at least in part, by the U-shaped electrode; and the second capacitor electrode is at least partially overlapped with each of the two comb-shaped electrodes in a direction perpendicular to the base substrate.

In some examples, the electrostatic discharge element comprises a plurality of transistors; each of the plurality of transistors comprises a gate electrode, a first electrode and a second electrode; the first electrode and the second electrode each transistor are electrically connected and serve as the first end of the electrostatic discharge element; and the gate electrode of each transistor serves as the second end of the electrostatic discharge element.

In some examples, the crack detection line comprises a third detection line portion and a fourth detection line portion both located in the main body area, and a bonding electrode located in the auxiliary area; the third detection line portion extends along an edge of the main body area, and the fourth detection line portion is on a side, close to the display area, of the third detection line portion; and the third detection line portion and the fourth detection line portion are not in direct electrical connection with each other in the main body area, and instead, are each electrically connected to the bonding electrode to receive a detection data signal.

In some examples, the crack detection line further comprises a connection portion in the auxiliary area; the connection portion is electrically connected to the bonding electrode; and the third detection line portion and the fourth detection line portion are each electrically connected to the connection portion and thereby connected to the bonding electrode.

In some examples, the plurality of subpixels comprise a first subpixel and a second pixel, and the display substrate further comprises a first switching element and a second switching element both located in the main body area, and a first data line and a second data line connected to the first subpixel and the second pixel, respectively; each of the first switching element and the second switching element comprises a control terminal, a first terminal and a second terminal; the first terminal of the first switching element is electrically connected to the third detection line portion, while the second terminal of the first switching element is electrically connected to the first data line; and the first terminal of the second switching element is electrically connected to the fourth detection line portion, while the second terminal of the second switching element is electrically connected to the second data line.

In some examples, the main body area is circular, elliptical or rectangular.

At least an embodiment of the present disclosure further provides a display apparatus comprising the display substrate provided by any one of the above embodiments.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

The edge of a display panel may easily crack under the action of stress, and the resulting crack may spread from the peripheral area to the display area of the display panel to affect the display function of the display area. To detect the crack in the display panel in time to increase the yield, usually a crack detection line is provided in the display panel to perform panel crack detection on the display panel. The crack detection line has one end configured to receive a detection signal and the other end connected to a subpixel in the display area through a switching element to a provide detection data signal. For example, in case of breakage of the panel crack detection, it may result in insufficient writing of the detection data signal or even that the detection data signal cannot be written. This may be confirmed from the lighted state of the pixel in the display area, whereby the crack detection can be realized.

When electrostatic discharge (ESD) takes place at the crack detection line, it may result in breakdown of the switching element connected with the crack detection line, leading to detection failure. Therefore, it is necessary to design an ESD unit on the crack detection line for protection.

With increasing demands on narrow bezels of display panels, flexible display substrates have been widely used. A flexible substrate may be bent such that part of the non-display area of a display panel can be bent to the back of the substrate, thereby providing a narrower lower bezel and increasing the screen-to-body ratio. For example, Chip On PI (COP) process has been widely used in the design of display panels, especially electronic products such as mobile phones and watches. Based on the bendability of a flexible substrate, the COP process may permit bending of a panel bonding area to provide a narrower lower bezel and increase the screen-to-body ratio.

Figure 1:
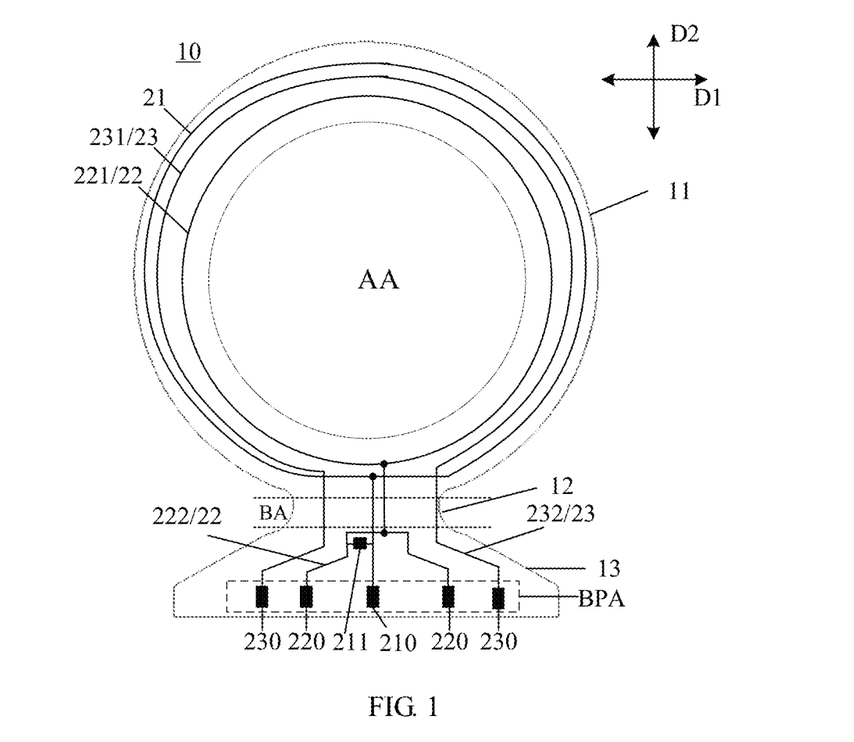
FIG. 1 is a schematic diagram of a display substrate provided in at least one embodiment of the present disclosure.

FIG. 1 is a schematic diagram of a display substrate according to at least one embodiment of the present disclosure. As shown in FIG. 1, the display substrate 10 includes a main body area 11, a necked-down area 12, and an auxiliary area 13. The necked-down area 12, illustrated exemplarily by dotted lines in FIG. 1, is located between and connects the main body area 11 and the auxiliary area 13.

As shown in FIG. 1, the necked-down area 12 is rectangular or strip-shaped. The length direction of the necked-down area 12 is defined as a first direction D1. The main body area 11, the necked-down area 12 and the auxiliary area 13 are sequentially connected along a second direction D2. The first direction D1 and the second direction D2 are different, for example, orthogonal to each other.

The main body area 11 includes a display area (area AA) of the display substrate. In other words, the necked-down area 12 and the auxiliary area 13 both belong to the non-display area of the display substrate. The main body area 11 further includes a non-display area outside the display area. The non-display area has, for example, lines such as a power line and a signal line disposed thereon.

The necked-down area 12 includes a bending area BA configured to be bendable such that the auxiliary area 13 is bent to a back of the main body area 11, thus increasing the screen-to-body ratio of the display area and realizing narrow bezel display. For example, the bending area is part or all of the necked-down area 12. For example, a bending axis of the bending area extends in the first direction D1.

For example, the auxiliary area 13 includes a bonding area BPA in which a bonding electrode is disposed. The bonding electrode may be bonded to an external circuit to provide a signal source or a driving circuit for the display substrate. For example, there may be a plurality of bonding areas. For example, the bonding electrode may be bonded to a flexible printed circuit (FPC) board to provide a power signal, a detection signal, a data signal or the like for the display substrate. In another examples, the bonding electrode may be bonded to an (IC) chip to provide a driving signal for the display substrate. The bonding area BPA is schematically illustrated by a dotted box in FIG. 1.

As shown in FIG. 1, the maximum size of the necked-down area 12 in the first direction D1 is smaller than that of the main body area 11 in the first direction D1 and also smaller than that of the auxiliary area 13 in the first direction D1.

For example, the main body area may be circular, elliptical or rectangular. As shown in FIG. 1, the main body area is circular. For example, the display substrate is applied to a small-sized wearable product. For example, the display substrate 10 may be used in a watch. For example, in the second direction D2, the size of the main body area 11 in the first direction D1 increases first and then decreases.

For example, in the second direction D2, the size of the necked-down area 12 in the first direction D1 decreases first and then increases. In another examples, in the second direction D2, the size of the necked-down 12 in the first direction D1 may remain basically unchanged.

For example, a chamfer is formed at the junction of the necked-down 12 and the main body area 11 and/or the auxiliary area 13.

For example, the maximum size of the necked-down area 12 in the first direction D1 is ⅙ to ⅓, for example, ⅕, of that of the main body area 11 in the first direction D1. Compared with the main body area 11, the size of the necked-down area 12 in the first direction D1 is relatively small so that the auxiliary area 13 can be sheltered by the main body area 11 after being bent backwards.

For example, in a direction which is parallel to the second direction D2 and away from the necked-down area 12, the size (i.e., the length) of the auxiliary area 13 in the first direction increases gradually so that the auxiliary area 13 can be enlarged while effectively sheltered by the main body area 11 after being bent backwards. For example, the auxiliary area 13 is fan-shaped, and includes, for example, a regularly trapezoidal region. The upper base of the regularly trapezoidal region is jointed to the necked-down area 12 and may have a length greater than or equal to that of the bottom edge of the necked-down area 12 (the case in which the two lengths are equal is shown in FIG. 1). The auxiliary area 13 may further include a rectangular region jointed to the lower base of the regularly trapezoidal region.

As shown in FIG. 1, the display substrate 10 further includes a crack detection line 21 which is located in the non-display area of the display substrate. For example, the crack detection line 21 extends along the edge of the display substrate 10 to realize detection on cracks in the edge of the substrate. For example, the crack detection line 21 extends from the main body area 11 through the necked-down area 12 to the auxiliary area 13. The portion, located in the main body area 11, of the crack detection line 21 surrounds, at least in part, the display area, or surrounds the display area to perform crack detection on the whole edge of the main body area 11. The crack detection line 21 has one end electrically connected to a bonding electrode 210 located in the bonding area BPA, and the bonding electrode 210 is bonded to an external circuit to receive a detection data signal.

The display substrate 10 further includes an electrostatic discharge element 211 electrically connected to the crack detection line 21 to provide electrostatic protection for the crack detection line. There may be one or more electrostatic discharge elements 211.

The electrostatic discharge element 211 may be an electrostatic discharge protection circuit in any form, for example, a resistor-capacitor (RC) filter circuit composed of a capacitor and a resistor. The embodiments of the present disclosure have no limitation on the specific implementation form of the electrostatic discharge element.

For example, the electrostatic discharge element 211 includes a capacitor which can store static electricity generated by the crack detection line 21.

In the design of the display substrate, a problem needing to be considered is how to dispose the electrostatic discharge element.

One of design methods is to dispose the electrostatic discharge element 211 in the non-display area of the main body area 11. However, to realize narrow bezel display, the space of the bezel (the non-display area) of the main body area of the display substrate is limited, especially in a small-sized wearable product. Therefore, it is disadvantageous for realizing narrow bezel display to arrange the electrostatic discharge element 211 in the auxiliary area 13.

Another one of design methods is to dispose the electrostatic discharge element 211 in the non-display area of the necked-down area 12. However, as shown in FIG. 1, the junction of the necked-down area 12 and the main body area 11 or the auxiliary area 13 has a certain camber, and the junction needs to be chamfered in the manufacturing process of the display substrate, which may result in great stress at the necked-down area 12. Especially, when the size of the necked-down area 12 in the first direction D1 is relatively small as compared with the main body area 11, the camber is great, thus further increasing the cutting stress on the necked-down area 12. On the other hand, the necked-down area 12 has the bending area BA and thus is further affected by bending stress. In this case, if the electrostatic discharge element 211 is disposed in the necked-down area 12, the structure complexity of a film in the necked-down area 12 will be increased. For example, the existence of the electrostatic discharge element may increase the height of the film in the area where the electrostatic discharge element is located, resulting in unevenness of the film and increasing the risk of breakage of the film in the necked-down area 12. This may eventually cause breakage of the crack detection line 21, leading to over detection of the crack or failure of crack detection and reduction in detection rate and yield of the product. In some examples, the crack detection line 21 is provided to perform crack detection on the main body area 11, thus protecting the display function of the display area AA from the influence of cracks of the main body area 11. When breakage takes place in the necked-down area 12 while not in the main body area 11, it will also cause breakage of the crack detection line 21, which may lead to over detection and hence reduction in effective detection rate.

At least one embodiment of the present disclosure provides a display substrate including a base substrate, a crack detection line and an electrostatic discharge element electrically connected to the crack detection line on the base substrate. The base substrate includes a main body area, an auxiliary area, and a necked-down area connecting the main body area and the auxiliary area, and the display area of the display substrate is located in the main body area. The crack detection line surrounds, at least in part, the display area and extends through the necked-down area to the auxiliary area. The electrostatic discharge element is located in the auxiliary area.

As shown in FIG. 1, the display substrate provided in at least one embodiment of the present disclosure is provided with, in the auxiliary area, the electrostatic discharge element 211 for the crack detection line. On the one hand, compared with that the electrostatic discharge element is disposed in the main body area, the electrostatic discharge element is disposed in the auxiliary area to be conducive to narrow bezel display; on the other hand, compared with that the electrostatic discharge element is disposed in the necked-down area, the risk of breakage of the film in the necked-down area is reduced, which may be conducive to increasing the product yield.

For example, the electrostatic discharge element 211 may be disposed in the trapezoidal region or the rectangular region of the auxiliary area 13. The length direction of the electrostatic discharge element 211 is parallel to any one edge of the trapezoidal region and the rectangular region. In other words, the length direction of the electrostatic discharge element 211 may be the first direction D1 or the second direction D2, and may also intersect both of the first direction D1 and the second direction D2. For example, the length direction of the electrostatic discharge element 211 is parallel to any one leg of the trapezoidal region.

For example, the base substrate is a flexible substrate, for example, may be formed from a plastic material with excellent heat resistance and bending resistance, such as polyimide (PI), polycarbonate (PC), polyethylene glycol terephthalate (PET), polyethylene, polyacrylate, polyarylate, polyetherimide, polyethersulfone, polyethylene terephthalate (PET), polyethylene (PE), polypropylene (PP), polysulfone (PSF), polymethyl methacrylate (PMMA), triacetate cellulose (TAC), cycloolefin polymer (COP) and cycloolefin copolymer (COC).

For example, a plurality of subpixels (not shown) are disposed in the display area AA. The plurality of subpixels are arranged into an array in the first direction D1 and the second direction D2.

For example, each subpixel includes a light-emitting element and a pixel circuit for driving the light-emitting element to emit light. For example, the pixel circuit may be an nTmC (n and m are positive integers), such as 2T1C (i.e., two transistors and one capacitor), 4T2C, 5T1C or 7T1C, pixel circuit. Moreover, in different embodiments, the pixel circuit may further include a compensating subcircuit which includes an internal compensating subcircuit or an external compensating subcircuit. The compensating subcircuit may include a transistor, a capacitor, etc. For example, as needed, the pixel circuit may further include a reset circuit, a light-emitting control subcircuit, a detection circuit, etc.

For example, the display substrate 20 may also include a control circuit (not shown). For example, the control circuit is configured to control a data driving circuit to provide the subpixel with a data signal and to control a gate electrode driving circuit to provide the subpixel with a scanning signal. An example of the control circuit is a timing control circuit (T-con). The control circuit may take various forms, for example, include a processor and a memory. The memory includes an executable code, and the processor runs the executable code to perform the above-mentioned detection method.

For example, the processor may be a central processing unit (CPU) or a processing unit in other form having data processing capability and/or instruction executing capability, for example, may include a microprocessor, a programmable logic controller (PLC), etc.

For example, the memory may include one or more computer program products. The computer program product may include a computer readable storage medium in any form, for example, a volatile memory and/or a nonvolatile memory. The volatile memory may include, for example, a random access memory (RAM) and/or a cache memory (cache), etc. The nonvolatile memory may include, for example, a read only memory (ROM), a hard disk, a flash memory, etc. One or more computer program instruction may be stored on the computer readable storage medium, and the processor may run a function desired by the program instructions. Various application programs and various kinds of data may also be stored on the computer readable storage medium.

For example, the display substrate 10 is an organic light-emitting diode display substrate. Correspondingly, the light-emitting element is an organic light-emitting diode.

For example, as shown in FIG. 1, the display substrate 10 further includes a first power line 22 and a second power line 23 both located in the non-display area. The first power line 22 and the second power line 23 are configured to provide a first power voltage VDD and a second power voltage VSS for a plurality of subpixels, respectively, and the first power voltage is higher than the second power voltage.

As shown in FIG. 1, the first power line 22 and the second power line 23 are each disposed, at least in part, around the display area AA, and extend through the necked-down area 12 to the auxiliary area 13. The first power line 22 is electrically connected to a bonding electrode 220 located in the bonding area BPA to receive the first power voltage and thereby transfer the first power voltage to the subpixels in the display area. The second power line 23 is electrically connected to a bonding electrode 230 located in the bonding area BPA to receive the second power voltage and thereby transfer the second power voltage to the subpixels in the display area.

For example, as shown in FIG. 1, the first power line 22 includes a power line body portion 221 located in the main body area 11 and a power line extension portion 222 located outside the main body area 11. For example, the power line body portion 221 is disposed completely surrounding the display area AA, and electrically connected to the power line extension portion 222. For example, the power line extension portion 222 extends from the necked-down area 12 to the auxiliary area 13 and thus is led to the bonding electrode 220 located in the bonding area BPA.

For example, as shown in FIG. 1, the second power line 23 includes a power line body portion 231 located in the main body area 11 and a power line extension portion 232 located outside the main body area 11. For example, the power line body portion 231 is Ω-shaped and is disposed around the display area AA, with two ends thereof extending along two sides of the substrate to be electrically connected to the power line extension portion 232, respectively. The power line extension portion 232 extends from the necked-down area 12 to the auxiliary area 13 and thus is led to the bonding electrode 230 located in the bonding area BPA.

For example, as shown in FIG. 1, the second power line 23 is located on the side, closer to the edge of the substrate, of the first power line 22.

For example, in the main body area 11, at least a portion of the crack detection line 21 is closer to the edge of the main body area 11 than the first power line 22 and the second power line 23, thereby facilitating crack detection on the edge of the substrate. For example, cracks usually occur in the edge of the substrate and spread to the interior of the substrate from the edge of the substrate.

For example, for the sake of clarity, FIG. 1 shows merely one circle of the crack detection line 21, which, however, should not be construed as limiting of the present disclosure. For example, the crack detection line 21 can be wound around the edge of the substrate back and forth so that the detection region can be enlarged, and the sensitivity of detection can be improved. For example, the crack detection line 21 overlaps, at least in part, the second power line 23 in a direction perpendicular to the base substrate.

For example, as shown in FIG. 1, the electrostatic discharge element 211 includes a first end electrically connected to the crack detection line 21, and a second end electrically connected to the first power line 22 or the second power line 23 to receive a fixed voltage, whereby the interference of the electrostatic discharge element 211 for a data signal on the crack detection line 21 can be reduced. For example, the electrostatic discharge element 211 includes a capacitor having a first capacitor electrode and a second capacitor electrode serving the first end and the second end of the electrostatic discharge element, respectively.

FIG. 1 only schematically shows the locations of the crack detection line 21, the first power line 22 and the second power line 23, which, however, should not be construed as limiting of the present disclosure.

Figure 2A:
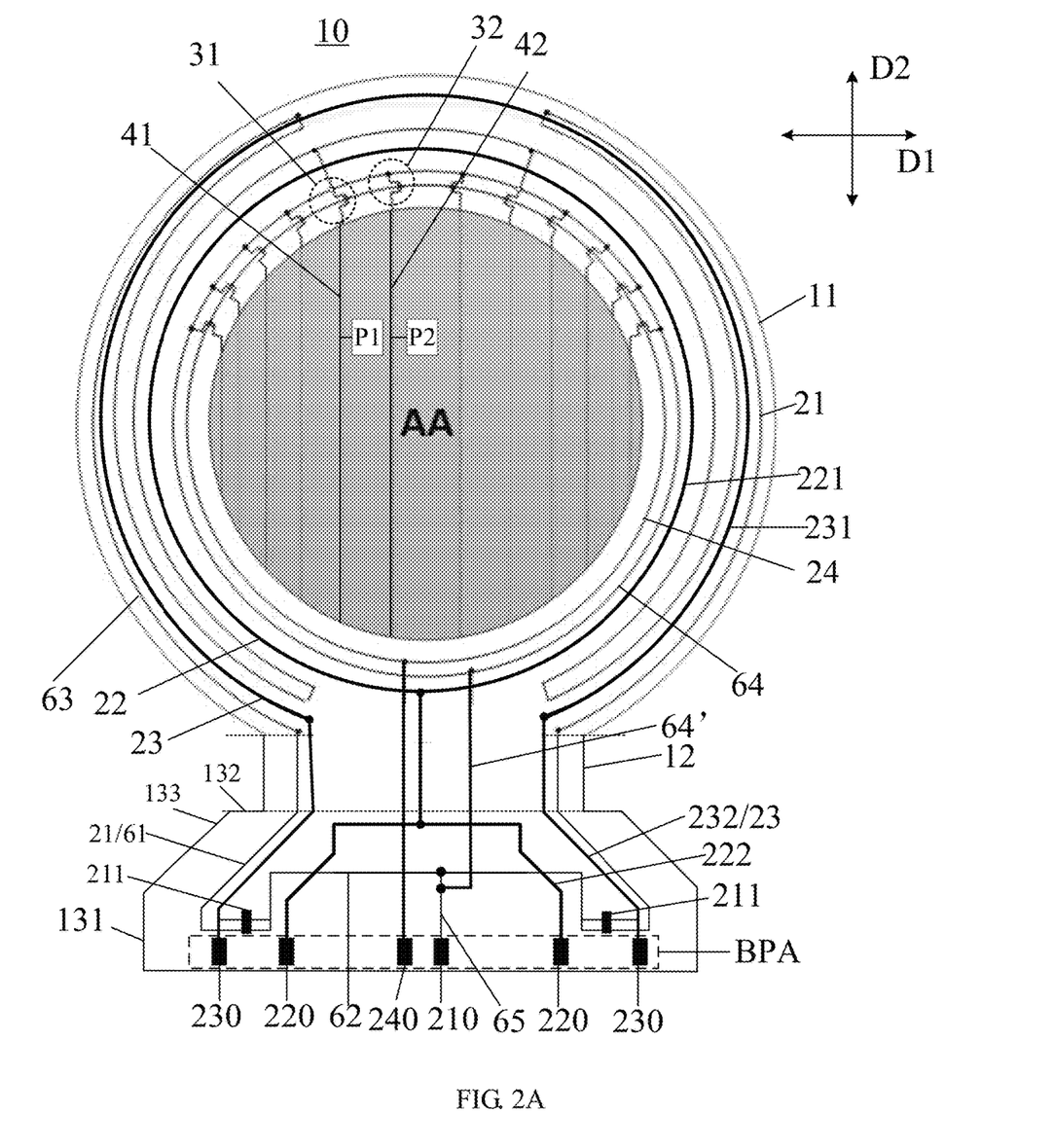
FIG. 2A is a schematic diagram of a display substrate provided in another embodiments of the present disclosure.
Figure 2B:
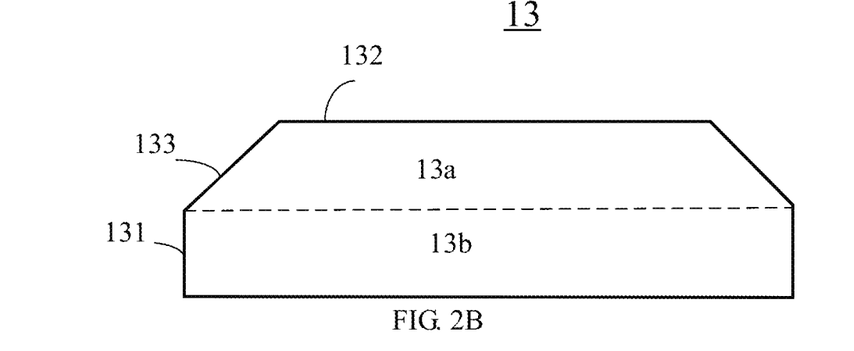
FIG. 2B is an enlarged schematic diagram of an auxiliary area in FIG. 2A.
Figure 2C:
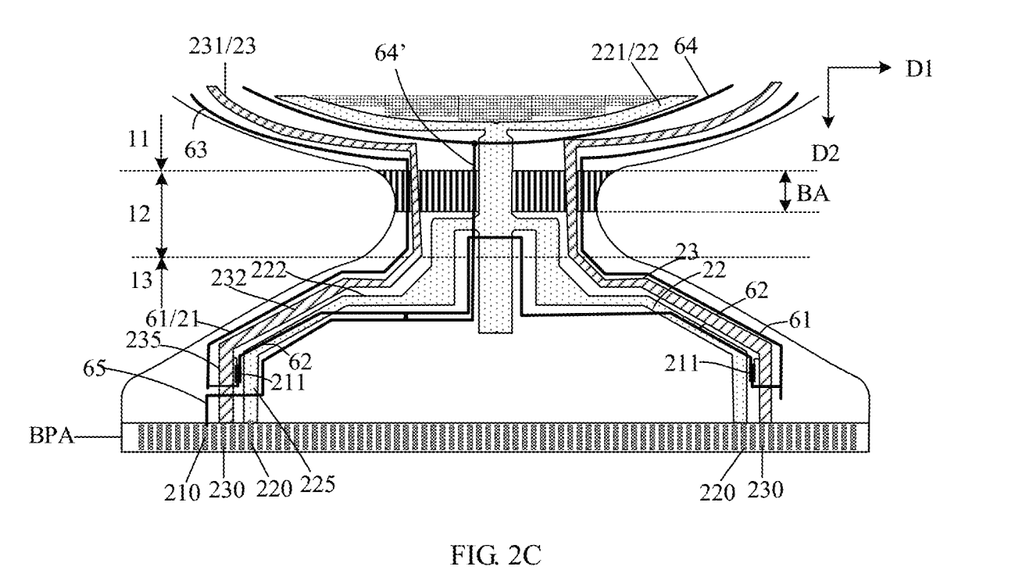
FIG. 2C is a schematic diagram of a display substrate provided in yet another embodiments of the present disclosure.

FIG. 2A is the schematic diagram of a display substrate provided in another embodiments of the present disclosure, and FIG. 2B is the enlarged schematic diagram of an auxiliary area of the display substrate in FIG. 2A. FIG. 2C is the schematic diagram of a display substrate provided in yet another embodiments of the present disclosure, which mainly shows the necked-down area 12 and the auxiliary area 13 of the display substrate.

For example, as shown in FIG. 2A and FIG. 2B, the auxiliary area 13 includes a trapezoidal region 13a and a rectangular region 13b connected in a second direction D2. FIG. 2B schematically shows the boundary between the trapezoidal region 13a and the rectangular region 13b by a dotted line. One side edge 131 of the rectangular region 13b is connected to one side edge 133 of the trapezoidal region 13a. The upper base 132 of the trapezoidal region 13a is connected to the necked-down area 12. The rectangular region 13b is located on the side, far away from the necked-down area 12, of the trapezoidal region 13a. The electrostatic discharge element may be disposed in the trapezoidal region 13a or the rectangular region 13b.

As shown in FIG. 2A and FIG. 2C, the electrostatic discharge element 211 is located in the rectangular region 13b. In this manner, the distance between the electrostatic discharge element 211 and the necked-down area 12 can be increased to reduce the influence of the arrangement of the electrostatic discharge element 211 on the necked-down area 12. Thus, the risk of film breakage in the necked-down area 12 can be reduced, and over detection or failure of detection caused by the film breakage can be avoided.

For example, the length direction of the electrostatic discharge element is parallel to any one edge of the trapezoidal region 13a and the rectangular region 13b.

Figure 3A:
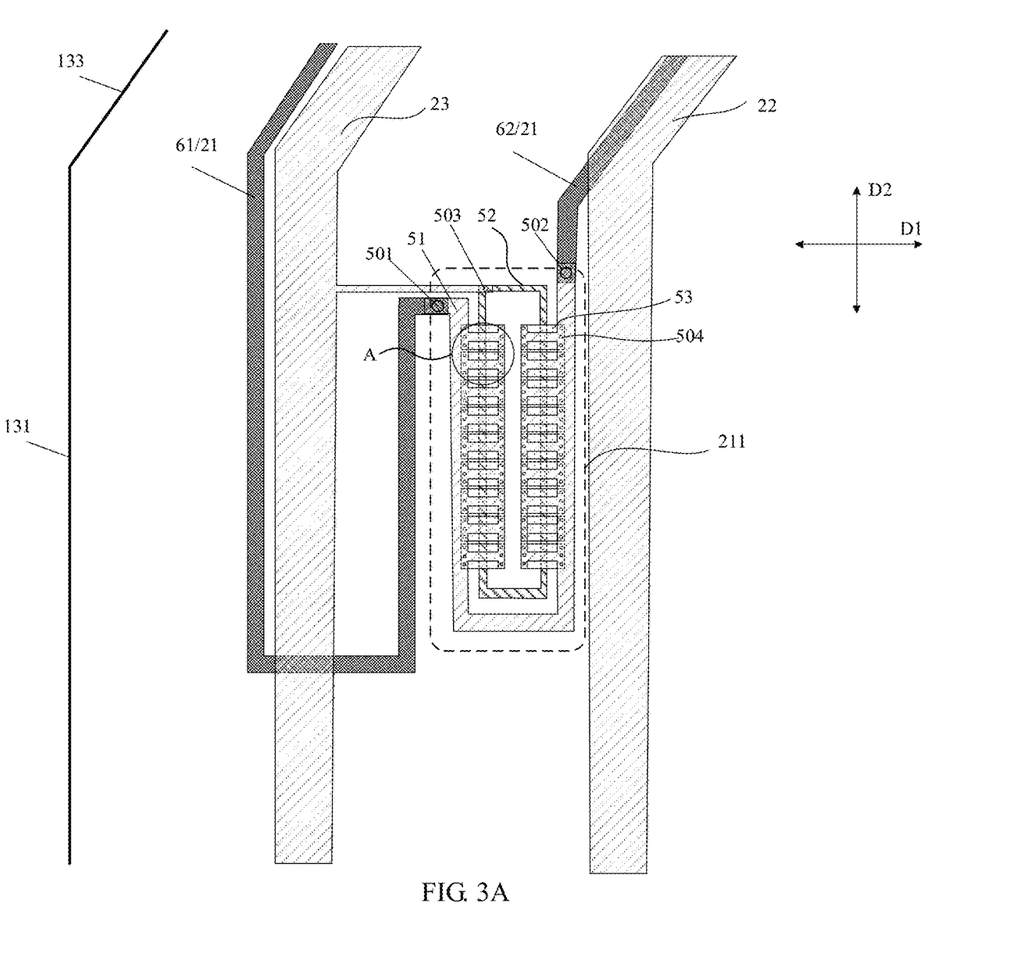
FIG. 3A is a partially enlarged schematic diagram of FIG. 2A.

For example, as shown in FIG. 2a, FIG. 2C and FIG. 3A, in a direction parallel to the surface of the base substrate, the electrostatic discharge element 211 is between the first power line 22 and the second power line 23 in the auxiliary area 13. In other words, the orthographic projection of the electrostatic discharge element 211 on the base substrate is between the orthographic projection of the first power line 22 on the base substrate and the orthographic projection of the second power line 23 on the base substrate.

For example, as shown in FIG. 2C, in the auxiliary area 13, the first power line 22 includes a power line portion 225 parallel to the second direction D2, and the second power line 23 includes a power line portion 235 parallel to the second direction D2. A gap is formed between the power line portion 225 and the power line portion 235, and the electrostatic discharge element 211 is located in the gap and electrically connected to the second power line 23.

Since the first power line 22 and the second power line 23 are configured to provide a high level voltage and a low level voltage, respectively, a relatively large gap is formed between the first power line 22 and the second power line 23 to avoid mutual interference of signals of the two power lines. Providing the electrostatic discharge element 211 between the first power line 22 and the second power line 23 allows for an increased space utilization rate and an optimized layout design.

For example, the first power line 22 and the second power line 23 are in the same layer and insulated from each other. At least a portion of the electrostatic discharge element is in the same layer with the first power line and the second power line and between the first power line 22 and the second power line 23.

It needs to be noted that the so-called "in the same layer" in the present disclosure refers to that, for example, a plurality of structures/patterns are prepared from the same material layer and thereby located at the same layer, and is not intended to define that they are located in the same horizontal plane.

FIG. 3A is the partially enlarged schematic diagram of FIG. 2A and FIG. 2C and illustrates the electrostatic discharge element by a dotted box. As shown in FIG. 2A, FIG. 2C and FIG. 3A, the electrostatic discharge element 211 is disposed along one side edge 131 of the rectangular region 13b in the auxiliary area 13. The electrostatic discharge element 211 and the side edge 131 both extend in the second direction D2.

For example, the first power line 22 and the second power line 23 each extend from the auxiliary area 13 through the necked-down area 12 to the main body area 11, and are wound around the display area AA and then go back to the auxiliary area 13 through the necked-down area 12. For example, the first power line 22 and the second power line 23 each are a-shaped.

For example, as shown in FIG. 2A, the second power line 23 is closer to the edge of the substrate than the first power line 22. In other words, the first power line 22 is closer to the display area AA. In this manner, the wiring can be optimized. For example, in the display substrate, a pixel electrode (e.g., a cathode) that receives the second power voltage VSS in the display area is typically disposed on the entire surface and thus prone to electrical connection with the second power line. The first power line 22 is disposed closer to the display area than the second power line 23, thereby facilitating the connection of the first power line 22 with the subpixels in the display area.

For example, as shown in FIG. 2A, in the auxiliary area 13, at least a portion of the crack detection line 21 is closer to the edge of the auxiliary area 13 than the first power line 22 and the second power line 23, thereby facilitating the crack detection on the edge of the substrate. For example, cracks usually occur in the edge of the substrate and spread to the interior of the substrate from the edge of the substrate.

With reference to FIG. 2A, FIG. 2C and FIG. 3A, the portion, located in the auxiliary area 13, of the crack detection line 21 includes a first detection line portion 61 and a second detection line portion 62. The first detection line portion 61 extends along the edge of the substrate from the side, far away from the first power line 22, of the second power line 23 to be between the second power line 23 and the first power line 22, and is electrically connected to the first end of the electrostatic discharge element 211 through a via hole 501. The second detection line portion 62 extends from the side, far away from the second power line 23, of the first power line 22 to be between the second power line 23 and the first power line 22, and is electrically connected to the first end of the electrostatic discharge element 211 through a via hole 502, whereby the first detection line portion 61 and the second detection line portion 62 of the crack detection line are electrically connected.

The first power line 22 includes a first power line portion parallel to the second direction D2 and the second power line 23 includes a second power line portion parallel to the second direction D2, and the electrostatic discharge element 211 is located between the first power line portion and the second power line portion.

With reference to FIG. 2A and FIG. 3A, the second end of the electrostatic discharge element 211 is electrically connected to the second power line 23 through a via hole 503.

For example, the electrostatic discharge element 211 includes a capacitor having a first capacitor electrode 51 and a second capacitor electrode 52 that serve as the first end and the second end of the electrostatic discharge element 211, respectively. The first capacitor electrode 51 is electrically connected to the crack detection line 21 through the via holes 501 and 502; the second capacitor electrode is electrically connected to the first power line 22 or the second power line 23, and FIG. 2A and FIG. 3 show the case in which the second capacitor electrode 52 is electrically connected to the second power line 23 through the via hole 503.

For example, the first capacitor electrode 51 is in the same layer with first power line 22 and the second power line 23 and located between the first power line and the second power line.

For example, the second capacitor electrode 52 is located on the side, close to the base substrate, of the first capacitor electrode 51, and the first capacitor electrode and the second capacitor electrode overlap at least in part in the direction perpendicular to the base substrate.

Figure 3B:
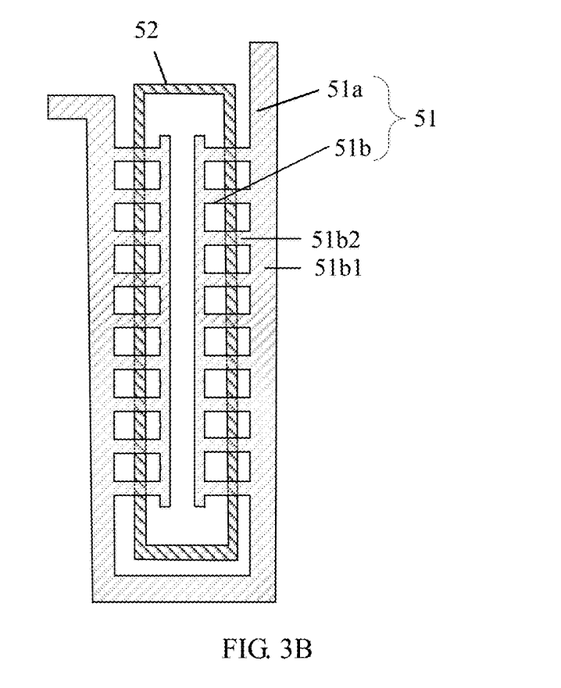
FIG. 3B is an enlarged schematic diagram of an electrostatic discharge element provided in at least one embodiment of the present disclosure.

FIG. 3B is the enlarged schematic diagram of the electrostatic discharge element. For the sake of clarity, FIG. 3B merely shows the first capacitor electrode 51 and the second capacitor electrode 52 of the electrostatic discharge element 211. With reference to FIG. 3A and FIG. 3B, the first capacitor electrode 51 includes a U-shaped electrode 51a, and two comb-shaped electrodes 51b that are connected to two side edges of the U-shaped electrode 51a, respectively; and the U-shaped electrode 51a and the two comb-shaped electrodes 51b are, for example, of an integrated structure. Each comb-shaped electrode 51b includes a comb handle 51b1 and a plurality of comb teeth 51b2 extended from the comb handle 51b1.

For example, the second capacitor electrode 52 is surrounded, at least in part, by the U-shaped electrode 51a, and overlaps, at least in part, each of the two comb-shaped electrodes 51b in the direction perpendicular to the base substrate. For example, the second capacitor electrode 52 is ring-shaped.

Figure 4A:
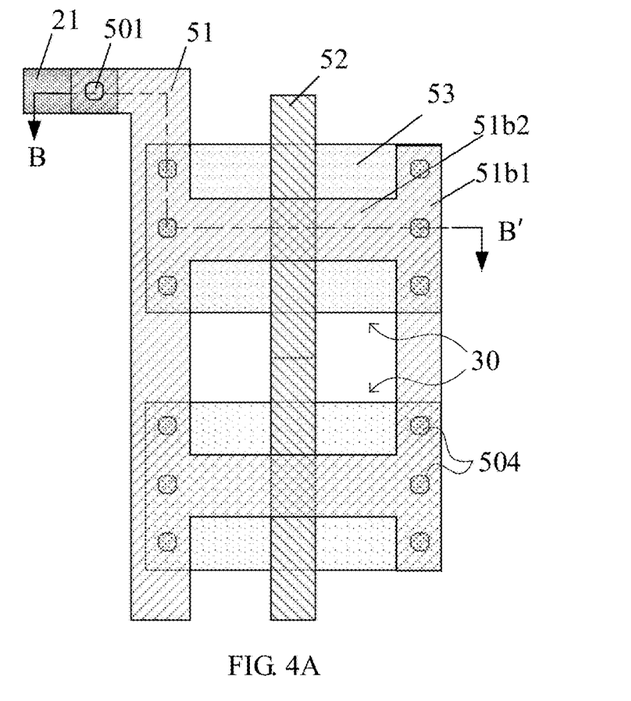
FIG. 4A is a partially enlarged schematic diagram of FIG. 3A.
Figure 4B:
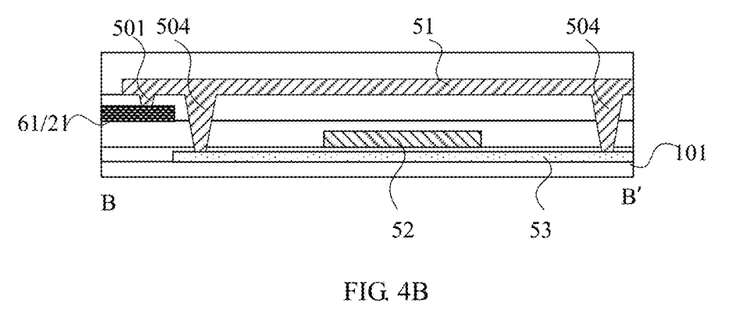
FIG. 4B is a sectional view taken along line B-B' in FIG. 4A.

FIG. 4A is the enlarged schematic diagram of area A in FIG. 3A. The area A involves two comb teeth 51b2, which are close to the first detection line portion 61 of the crack detection line, of the comb-shaped electrode 51b. FIG. 4B is the sectional view taken along line B-B' in FIG. 4A.

For example, as shown in FIG. 3A, FIG. 4A and FIG. 4B, the electrostatic discharge element 211 further includes a third capacitor electrode 53. For example, in the direction perpendicular to the base substrate which, the third capacitor electrode 53 is located on the side, far away from the first capacitor electrode 51, of the second capacitor electrode 52 and is electrically connected to the first capacitor electrode through a via hole 504. Thus, the electrostatic discharge element 211 has a structured formed by two capacitors connected in parallel, which is conducive to increasing the capacitance and improving the electrostatic protection performance.

For example, the third capacitor electrode 53 includes a conductive semiconductor material. The semiconductor material includes but is not limited to Si-based materials (amorphous silicon (a-Si), polycrystalline silicon (p-Si), etc.), metal-oxide semiconductors (IGZO, ZnO, AZO, IZTO, etc.), and organic materials (sexithiophene, polythiophene, etc.).

For example, as shown in FIG. 4B, the crack detection line 21 is located between the first capacitor electrode 51 and the second capacitor electrode 52 in the direction perpendicular to the base substrate 10.

Figure 5:
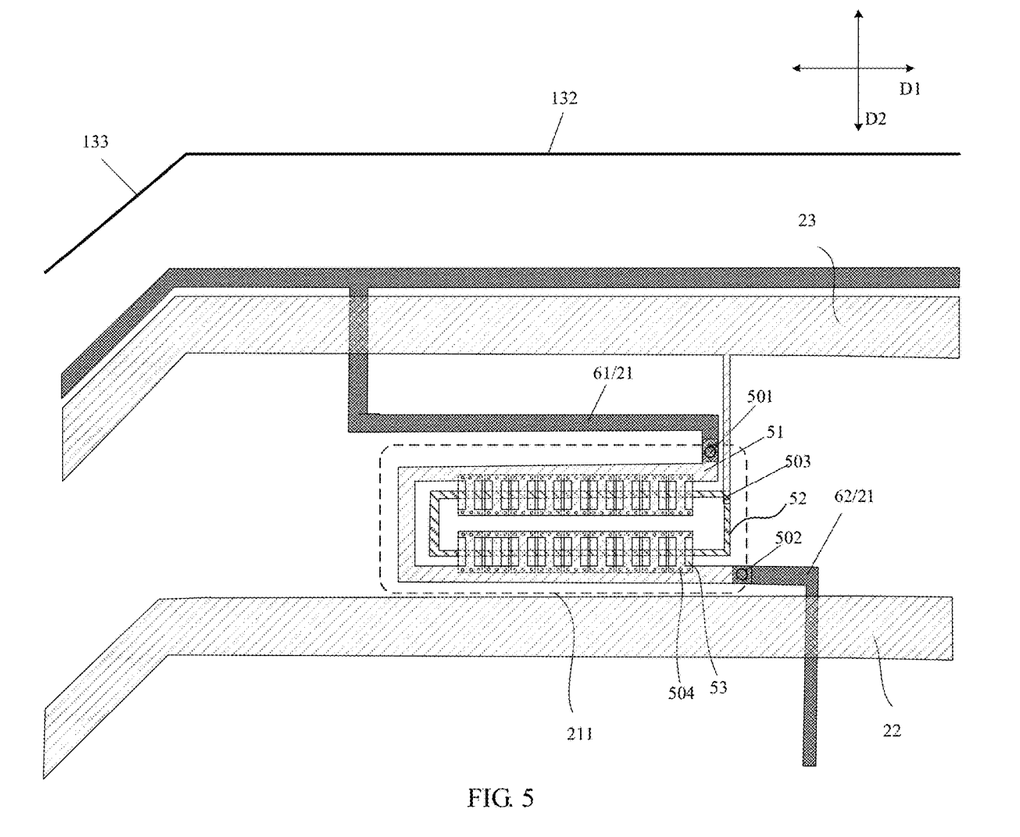
FIG. 5 is a schematic diagram of a display substrate provided in still another embodiments of the present disclosure.

In another examples, as shown in FIG. 5, the electrostatic discharge element 211 may also be disposed along a side of the trapezoidal region of the auxiliary area, and with reference to FIG. 2B, this side is, for example, the upper base 132 of the trapezoidal region 13a and parallel to the first direction D1. The first power line 22 includes a third power line portion parallel to the first direction and the second power line 23 includes a fourth power line portion both parallel to the first direction, and the electrostatic discharge element 211 is located between the third power line portion and the fourth power line portion.

For example, the trapezoidal region 13a further includes a side edge 133 which intersects both of the first direction D1 and the second direction D2 and connects the side edge 131 and the upper base 132. In another examples, the electrostatic discharge element 211 may also disposed along the side edge 133.

For example, the electrostatic discharge element 211 may also be taken as including a plurality of transistors 30. The second capacitor electrode 52 may be taken as a gate electrode of the transistor 30, and the U-shaped electrode 51a and the comb handle 51b1 of the comb-shaped electrode 51b may be taken as the first electrode and the second electrode of the transistor, respectively. The third capacitor electrode 53 serves as an active layer of the transistor, and the portion, sheltered by the comb tooth 51b2, of the active layer serves as a channel region of the transistor, while the portion not sheltered by the second capacitor electrode 52 (i.e., the gate electrode) is made to be conductive in the manufacturing process (e.g., the self-alignment process of the gate electrode) to form source and drain contact regions of the transistor and are respectively electrically connected to the first electrode and the second electrode of the transistor.

For example, the first electrodes of a plurality of transistors are electrically connected to one another, and the second electrodes of the plurality of transistors are electrically connected to one another, such that the plurality of transistors are connected in parallel to one another.

Figure 6:
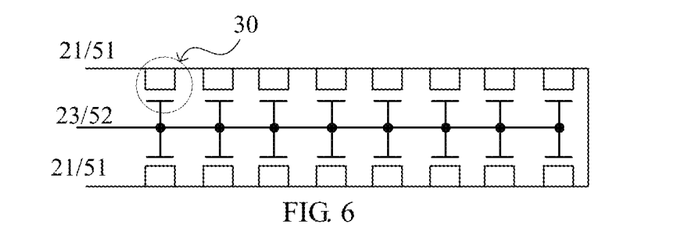
FIG. 6 is a circuit schematic diagram of an electrostatic discharge element provided in at least one embodiment of the present disclosure.

As shown in FIG. 4A, each transistor 30 corresponds to one comb tooth 51b2 that electrically connects the first electrode and the second electrode of the corresponding transistor to form a source-drain short-circuited structure. FIG. 6 is the circuit diagram of the electrostatic discharge element provided in at least one embodiment of the present disclosure, which shows the connection schematic diagram of the plurality of transistors 30.

It needs to be noted that all the transistors used in the embodiments of the present disclosure may be thin film transistors or field effect transistors or other switching devices having the same characteristics. The thin film transistor is described as an example in the embodiments of the present disclosure. The source and the drain of the transistor used herein may be structurally symmetrical and thus may be structurally indistinguishable. In an embodiment of the present disclosure, to distinguish between other two electrodes than the gate electrode of the transistor, one electrode is directly described as the first electrode, while the other electrode as the second electrode.

For example, the first capacitor electrode 51, the second capacitor electrode 52 and the crack detection line 21 are each made of a material that may be selected from a group consisting of gold (Au), silver (Ag), copper (Cu), aluminum (Al), molybdenum (Mo), magnesium (Mg), tungsten (W) and alloy materials formed by such metals, and conductive metal oxide materials such as indium tin oxide (ITO), indium zinc oxide (IZO), zinc oxide (ZnO), and zinc oxide aluminum (AZO).

The principle of crack detection for the display substrate provided in the embodiments of the present disclosure will be explained with a detection circuit shown in FIG. 2A as an example, which, however, shall not be construed as limiting of the present disclosure.

As shown in FIG. 2A, the portion, located in the main body area 11, of the crack detection line 21 includes a third detection line portion 63 and a fourth detection line portion 64, and third detection line portion 63 is on the side, close to the edge of the substrate, of the fourth detection line portion 64. The third detection line portion 63 and the fourth detection line portion 64 are not in direct electrical connection with each other, and instead, are each electrically connected to the bonding electrode 210.

For example, as shown in FIG. 2A and FIG. 2C, the crack detection line 21 includes a connection portion 65 directly connected to the bonding electrode 210, and the third detection line portion 63 is electrically connected to the connection portion 65 through the first detection line portion 61 and the second detection line portion 62. For example, the third detection line portion 63 is electrically connected to the first detection line portion 61, while the first detection line portion 61 is electrically connected to the second detection line portion 62 through the electrostatic discharge element 211, and the second detection line portion 62 is electrically connected to the connection portion 65 and thereby connected to the bonding electrode.

For example, the fourth detection line portion 64 is electrically connected to the connection portion 65 through a connection line 64'. For example, the connection line 64' and the connection portion 65 are of an integrated structure.

Since the third detection line portion 63 and the fourth detection line portion 64 are respectively electrically connected to the connection portion 65, normal transmission of the detection data signal over the fourth detection line portion 64 may not be affected if the third detection line portion 63 is broken due to the breakage of the edge of the display substrate.

In this embodiment, the fourth detection line portion 64 is electrically connected to the connection portion 65 through the connection line 64' and thereby connected to the same bonding electrode 210 with the third detection line portion 63 such that the first terminals of a first switching element 31 and a second switching element 32 receive the same detection data signal, which, however, shall not be construed as limiting of the present disclosure. In another embodiments, the fourth detection line portion 64 may also be connected to a different bonding electrode; the fourth detection line portion 64 may not be a portion of the crack detection line 21, and instead, be an individual signal line. For example, during the crack detection performed on the display substrate, the bonding electrode connected to the fourth detection line portion 64 and the bonding electrode 210 connected to the third detection line portion 63 may be loaded with the same data detection signal such that the first terminals of the first switching element 31 and the second switching element 32 receive the same detection data signal.

For example, as shown in FIG. 2A, the third detection line portion 63 extends along the substrate to be electrically connected with the first detection line portion 61 in the auxiliary area 13. For example, at least a portion of the third detection line portion 63 is located on the side, far away from the display area AA, of the second power line 23. For example, the third detection line portion 63 may be wound around the edge of the substrate back and forth and eventually extend to the edge of the opposite side of the substrate, thereby forming an approximately a-shaped outline. For example, the crack detection line 21 is wound back and forth in this manner so that the detection area can be increased, thus improving the sensitivity of detection. For example, as shown in FIG. 2A, in the course of winding back and forth, the third detection line portion 63 may extend from the outer side (the side close to the edge of the substrate) of the second power line 23 to the inner side of the second power line such that the third detection line portion 63 and the second power line 23 overlap at least in part in the direction perpendicular to the base substrate.

For example, the fourth detection line portion 64 is located on the side, close to the display area AA, of the third detection line 63, the first power line 22 and the second power line 23. For example, the fourth detection line portion 64 extends, at least in part, around the display area AA. For example, as shown in FIG. 2A, the fourth detection line portion 64 is formed into a ring shape surrounding the display area AA.

For example, the display substrate 10 includes a plurality of switching elements which are, for example, disposed around the display area AA. Each switching element includes a control terminal, a first terminal and a second terminal, and the first terminal and the second terminal can be switched on or off in response to a control signal received by the control terminal. For example, the switching element may be implemented by a transistor, which may be, for example, a thin film transistor or a field effect transistor or other switching device having the same characteristics.

For example, as shown in FIG. 2A, the display substrate further includes a signal control line 24 which, for example, is disposed around the display area and electrically connected to the control terminals of the plurality of switching elements to control switch-on or switch-off of the plurality of switching elements. The signal control line is electrically connected to the bonding electrode 240 located in the bonding area to receive a control signal.

For example, the display substrate further includes a plurality of data lines in one-to-one corresponding connection with a plurality of columns of subpixels, with each data line being connected to the corresponding column of subpixels to provide a data signal.

For example, the plurality of data lines correspond to the plurality of switching elements in a one to one correspondence. The first terminal of each switching element is connected to the crack detection line 21 to receive a detection data signal, while the second terminal of the switching element is electrically connected to the corresponding data line, and the switching element transmits the detection data signal which is used for crack detection to the data line in response to the voltage of the control terminal.

As shown in FIG. 2A, the first terminals of some switching elements, i.e., first switching elements 31, are electrically connected to the third detection line portion 63 on the outer side to receive the detection data signal over the crack detection line, while the first terminals of another switching elements, i.e., second switching elements 32, are electrically connected to the fourth detection line portion 64 on the inner side to receive the detection data signal. The second terminal of the first switching element 31 is electrically connected to a first data line 41 to provide the detection data signal for a first subpixel P1 connected to the first data line 41. The second terminal of the second switching element 32 is electrically connected to a second data line 42 to provide the detection data signal for a second subpixel P2 connected to the second data line.

In case of breakage of the edge of the substrate, the crack detection line at this position is broken such that the detection data signal cannot be sufficiently transferred and even cannot be transferred to the first terminal of the switching element 31, resulting in a column of first subpixels P1 connected to the first data line 41 being lighted to prompt an anomaly. Thus, it can be determined that cracks occur.

For example, in case of breakage of the edge of the substrate, the third detection line portion 63 at the edge of the substrate is broken such that the detection data signal cannot be sufficiently transferred and even cannot be transferred to the first terminal of the switching element 31, resulting in a column of first subpixels P1 connected to the first data line 41 being lighted to prompt an anomaly. By contrast, the transmission of the detection data signal over the fourth detection line portion 64 is not affected. For example, the second subpixel P2 connected to the second data line 42 can be lighted normally, for example, shows black and thus can provide a background pattern for contrast.

For example, the detection data signal is a black data signal, and it is displayed as black in a normal region and displayed as a bright line or a low dark line in an abnormal region (e.g., the region of the column of first subpixels). Thus, it can be determined that cracks occur.

For example, the number of the first switching elements 31 is smaller than the number of the second switching elements 32 so that the contrast can be improved. As shown in FIG. 2A, the number of the first switching elements 31 is two, and the two first switching elements, for example, are disposed symmetrically about an axis of symmetry in the second direction D2 in the display substrate.

At least one embodiment of the present disclosure further provides a display panel including any display substrate 10 described above. For example, the display panel is an organic light-emitting diode (OLED) display panel, and correspondingly, the display substrate 10 included therein is an OLED display substrate. The display substrate may include or not include a light-emitting element. In other words, the light-emitting element may be formed in a panel factory after the display substrate 10 is completed. In the case in which the display substrate 10 includes no light-emitting element therein, the display panel provided in the embodiments of the present disclosure further includes a light-emitting element in addition to the display substrate 10.

Figure 7:
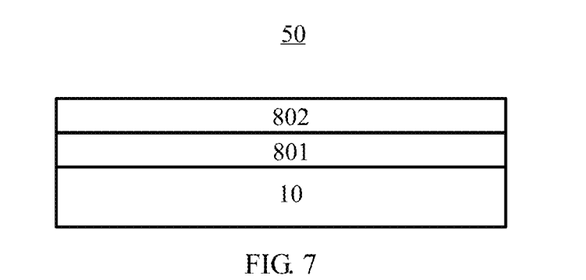
FIG. 7 is a schematic diagram of a display panel provided in at least one embodiment of the present disclosure.

As shown in FIG. 7, for example, the display panel 50 further includes a packaging layer 801 and a cover plate 802 that are disposed on the display substrate 10. The packaging layer 801 is configured to seal the light-emitting element on the display substrate 10 to prevent external moisture and oxygen from infiltration to the light-emitting element and a driving subcircuit to cause damage thereto. For example, the packaging layer 801 includes an organic thin film or an alternately stacking structure of inorganic-organic-inorganic thin films. For example, a water absorbing layer (not shown) may also be disposed between the packaging layer 801 and the display substrate 10, which is configured to absorb residual water vapor or sol on the light-emitting element resulting from the pre-production process. The cover plate 802 is, for example, a glass cover plate or a flexible cover plate. For example, the cover plate 802 and the packaging layer 801 may be of an integrated structure.

Figure 8:
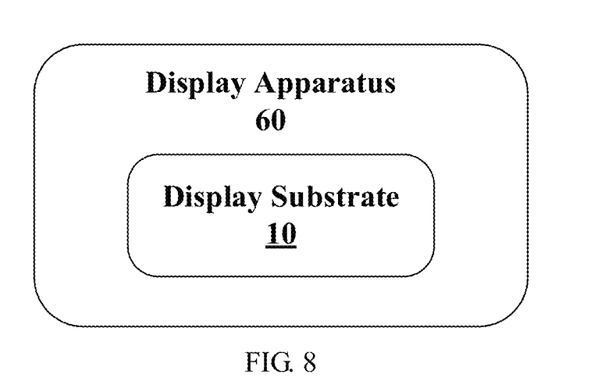
FIG. 8 is a schematic diagram of a display apparatus provided in at least one embodiment of the present disclosure.

At least one embodiment of the present disclosure further provides a display apparatus 60. As shown in FIG. 8, the display apparatus 60 includes any display substrate 10 or display panel 50 described above. The display apparatus provided in this embodiment may be any product or component having the display function, such as a display, an OLED panel, an OLED television, an electronic paper, a mobile phone, a tablet computer, a notebook computer, a digital photo frame and a navigator.

The foregoing are merely descriptions of the exemplary embodiments of the present disclosure and are not meant to limit the protection scope of the present disclosure. The protection scope of the present disclosure is defined by the appended claims.

The invention claimed is:

1. A display substrate, comprising:
a base substrate in an integral structure_comprising a main body area, an auxiliary area, and a necked-down area connecting the main body area and the auxiliary area, wherein a display area of the display substrate is located in the main body area;
a crack detection line surrounding, at least in part, the display area and extended through the necked-down area to the auxiliary area; and
an electrostatic discharge element electrically connected to the crack detection line,
wherein a length direction of the necked-down area is parallel to a first direction; the main body area, the necked-down area and the auxiliary area are connected in a second direction which intersects the first direction;
a maximum size of the necked-down area in the first direction is smaller than a maximum size of the main body area in the first direction and also smaller than a maximum size of the auxiliary area in the first direction; and
the electrostatic discharge element is located in the auxiliary area.

2. The display substrate according to claim 1, wherein the necked-down area comprises a bending are, and the bending area is configured to be bendable such that the auxiliary area is bent to a back of the main body area.

3. The display substrate according to claim 1, wherein a ratio of the maximum size of the necked-down area in the first direction to the maximum size of the main body area in the first direction ranges from 1/6 to 1/3.

4. The display substrate according to claim 1, wherein a size of the auxiliary area in the first direction increases gradually in a direction which is parallel to the second direction and away from the necked-down area.

5. The display substrate according to claim 1, wherein the auxiliary area comprises a trapezoidal region and a rectangular region connected along the second direction, and an upper base of the trapezoidal region is jointed to the necked-down area; and
the electrostatic discharge element is located in the trapezoidal region or the rectangular region.

6. The display substrate according to claim 5, wherein a length direction of the electrostatic discharge element is parallel to any edge of one of the trapezoidal region or the rectangular region.

7. A display apparatus comprising the display substrate according to claim 1.

8. The display substrate according to claim 1, wherein there is a chamfer angle at a junction between the necked-down area and the main body area or the auxiliary area.

9. A display substrate, comprising:
a base substrate comprising a main body area, an auxiliary area, and a necked-down area connecting the main body area and the auxiliary area, wherein a display area of the display substrate is located in the main body area;
a crack detection line surrounding, at least in part, the display area and extended through the necked-down area to the auxiliary area; and
an electrostatic discharge element electrically connected to the crack detection line,
wherein a length direction of the necked-down area is parallel to a first direction; the main body area, the necked-down area and the auxiliary area are connected in a second direction which intersects the first direction;
a maximum size of the necked-down area in the first direction is smaller than a maximum size of the main body area in the first direction and also smaller than a maximum size of the auxiliary area in the first direction; and
the electrostatic discharge element is located in the auxiliary area; and
the display substrate further comprises a first power line and a second power line, and a plurality of subpixels in the display area,
wherein the first power line and the second power line are each at least partially around the display area and extend through the necked-down area to the auxiliary area, and are configured to provide a first power voltage and a second power voltage for the plurality of subpixels, respectively, with the first power voltage being higher than the second power voltage; and
the electrostatic discharge element is between the first power line and the second power line in the auxiliary area.

10. The display substrate according to claim 9, wherein the first power line and the second power line are disposed in a same layer and insulated from each other; and
at least a portion of the electrostatic discharge element is in the same layer with the first power line and the second power line and is between the first power line and the second power line.

11. The display substrate according to claim 9, wherein the electrostatic discharge element comprises a first end electrically connected to the crack detection line and a second end electrically connected to the first power line or the second power line.

12. The display substrate according to claim 11, wherein the crack detection line comprises a first detection line portion and a second detection line portion both located in the auxiliary area;
the first detection line portion is extended from a side, far away from the second power line, of the first power line to be between the first power line and the second power line, and is electrically connected to the first end of the electrostatic discharge element;
the second detection line portion extends from a side, far away from the first power line, of the second power line to be between the first power line and the second power line, and is electrically connected to the first end of the electrostatic discharge element; and
the first end of the electrostatic discharge element electrically connects the first detection line portion and the second detection line portion.

13. The display substrate according to claim 11, wherein the electrostatic discharge element comprises a capacitor having a first capacitor electrode serving as the first end and of the electrostatic discharge element and a second capacitor electrode serving as the second end of the electrostatic discharge element.

14. The display substrate according to claim 13, wherein relative to the base substrate, the first capacitor electrode is in a same layer with the first power line and the second power line and is between the first power line and the second power line;
the second capacitor electrode is on a side, close to the base substrate, of the first capacitor electrode, and the first capacitor electrode and the second capacitor electrode are at least overlapped in a direction perpendicular to the base substrate.

15. The display substrate according to claim 13, wherein the crack detection line is between a layer where the first capacitor electrode is located and a layer where the second capacitor electrode is located in a direction perpendicular to the base substrate.

16. The display substrate according to claim 13, wherein the first capacitor electrode comprises a U-shaped electrode and two comb-shaped electrodes that are respectively connected to two side edges of the U-shaped electrode; and
the second capacitor electrode is surrounded, at least in part, by the U-shaped electrode; and the second capacitor electrode is at least partially overlapped with each of the two comb-shaped electrodes in a direction perpendicular to the base substrate.

17. The display substrate according to claim 11, wherein the electrostatic discharge element comprises a plurality of transistors;
each of the plurality of transistors comprises a gate electrode, a first electrode and a second electrode; the first electrode and the second electrode of each transistor are electrically connected and serve as the first end of the electrostatic discharge element; and
the gate electrode of each transistor serves as the second end of the electrostatic discharge element.

18. A display substrate, comprising:
a base substrate comprising a main body area, an auxiliary area, and a necked-down area connecting the main body area and the auxiliary area, wherein a display area of the display substrate is located in the main body area;
a crack detection line surrounding, at least in part, the display area and extended through the necked-down area to the auxiliary area; and
an electrostatic discharge element electrically connected to the crack detection line,
wherein a length direction of the necked-down area is parallel to a first direction; the main body area, the necked-down area and the auxiliary area are connected in a second direction which intersects the first direction;
a maximum size of the necked-down area in the first direction is smaller than a maximum size of the main body area in the first direction and also smaller than a maximum size of the auxiliary area in the first direction; and
the electrostatic discharge element is located in the auxiliary area; and
wherein the crack detection line comprises a first detection line portion and a second detection line portion both located in the main body area, and the display substrate further comprises a bonding electrode in the auxiliary area;
the first detection line portion extends along an edge of the main body area, and the second detection line portion is on a side, close to the display area, of the first detection line portion; and
the first detection line portion and the second detection line portion are not in direct electrical connection with each other in the main body area, and instead, are each electrically connected to the bonding electrode to receive a detection data signal.

19. The display substrate according to claim 18, wherein the crack detection line further comprises a connection portion in the auxiliary area;
the connection portion is electrically connected to the bonding electrode; and the first detection line portion and the second detection line portion are each electrically connected to the connection portion and thereby connected to the bonding electrode.

20. The display substrate according to claim 18, wherein the plurality of subpixels comprise a first subpixel and a second subpixel, and the display substrate further comprises:
a first switching element and a second switching element both located in the main body area, and
a first data line connected to the first subpixel and a second data line connected to the second subpixel,
wherein each of the first switching element and the second switching element comprises a control terminal, a first terminal and a second terminal;
the first terminal of the first switching element is electrically connected to the first detection line portion, and the second terminal of the first switching element is electrically connected to the first data line; and
the first terminal of the second switching element is electrically connected to the second detection line portion, and the second terminal of the second switching element is electrically connected to the second data line.

* * * * *